United States Patent [19]

Sandberg

[11] Patent Number: 4,698,583

[45] Date of Patent: Oct. 6, 1987

[54] METHOD OF MONITORING A HEATER FOR FAULTS

[75] Inventor: Chester L. Sandberg, Palo Alto, Calif.

[73] Assignee: Raychem Corporation, Menlo Park, Calif.

[21] Appl. No.: 716,780

[22] Filed: Mar. 26, 1985

[51] Int. Cl.[4] .......................... G01R 31/12; H05B 1/02; H02H 7/00

[52] U.S. Cl. .......................... 324/546; 219/509; 219/544; 338/22 R; 361/100

[58] Field of Search .......................... 324/52, 54, 51; 361/100, 101, 104, 106; 219/509, 507, 544, 534, 548, 549, 505, 504; 340/640, 655; 338/22 R, 214

[56] References Cited

U.S. PATENT DOCUMENTS

| | | | |
|---|---|---|---|
| 2,752,590 | 6/1956 | Towle | 324/54 X |
| 3,005,150 | 10/1961 | Behr | 324/54 |
| 3,277,364 | 10/1966 | Abrahamson | 324/54 |
| 3,359,434 | 12/1967 | Galluzzi | 361/104 X |
| 3,475,594 | 10/1969 | Aisanich | 219/509 |
| 3,761,734 | 9/1973 | Windecker | 361/104 |
| 3,941,975 | 3/1976 | Newman et al. | 361/100 X |
| 4,435,639 | 3/1984 | Gurevich | 219/544 |
| 4,487,057 | 12/1984 | Lutz | 324/52 X |
| 4,529,959 | 7/1985 | Ito et al. | 338/295 |

*Primary Examiner*—Gerard R. Strecker
*Assistant Examiner*—Jack B. Harvey
*Attorney, Agent, or Firm*—Timothy H. P. Richardson; Herbert G. Burkard

[57] ABSTRACT

Method for monitoring the electrical integrity of a heater and a novel heater for use in such a method. The heater includes an elongate heating member; an insulating jacket which encloses the heating member; a first electrically conductive member which surrounds the insulating jacket; a separating and insulating member which surrounds the first conductive member; and a second electrically conductive member which surrounds the first conductive member and is separated and insulated therefrom by the separating member. The method includes the step of testing the electrical relationship between the first and second electrically conductive members.

7 Claims, 4 Drawing Figures

METHOD OF MONITORING A HEATER FOR FAULTS

BACKGROUND OF THE INVENTION

1. Field of the Invention

This invention relates to methods for monitoring the electrical integrity of an article, for example, a heater, and to a novel heater for use in such methods.

2. Introduction of the Invention

It is important to monitor the electrical integrity of a heater that may have incurred physical damage, for example, a puncture or erosion of insulation members that make up the heater. In this way, one can reduce the possibility that a defective heater will be employed, and cause, for example, an explosion or flaming. This is particularly important for heaters to be employed in hazardous environments.

SUMMARY OF THE INVENTION

I have now discovered an efficient and advantageous method for monitoring the electrical integrity of an article, for example, a heater, and a novel heater for use in such a method.

In one aspect, the present invention provides a heater which comprises (a) an elongate heating member;

(b) an insulating jacket which encloses the heating member;

(c) a first electrically conductive member which surrounds the insulating jacket;

(d) a separating and insulating member which surrounds the first conductive member; and (e) a second electrically conductive member which surrounds the first conductive member and is separated and insulated therefrom by the separating member.

In another aspect the invention provides a method for monitoring the integrity of an article which comprises (a) a substrate member;

(b) an insulating jacket which encloses the substrate member;

(c) a first electrically conductive member which surrounds the insulating jacket;

(d) a separating and insulating member which surrounds the first conductive member; and (e) a second electrically conductive member surrounds the first conductive member and is separated and insulated therefrom by the separating member which method comprises the step of testing the electrical relationship between the first and second electrically conductive member.

Preferably, the article is a heater and the substrate is an elongate heating member.

BRIEF DESCRIPTION OF THE DRAWING

The invention is illustrated in the accompanying drawing, in which.

DETAILED DESCRIPTION OF THE INVENTION

The heating member preferably comprises a plurality of electrical elements which are connected in parallel with each other between at least two elongate electrodes. Preferably, the electrical elements comprise a continuous strip of a PTC conductive polymer. Preferably, the heating member is a self-regulating heating member.

Preferably, at least one of the first and second electrically conductive members comprises wire braid. These members can comprise, on the other hand, conductive ink, shredded metal or micro encapsulated conducting substances.

The insulating jacket preferably comprises polymer insulator, but may comprise a micro encapsulated insulator, a self-repairing gel, semiconducting materials or mechanically breakable beads.

Preferably, the separating and insulating member comprises a low mechanical property polymer and is a mechanically and electrically weaker insulator than the primary electrically insulating jacket.

The present invention can monitor an article and provide indication of damage to the article. Instruction as to how one can determine where an article may be damaged is disclosed in copending and commonly assigned Application Ser. Nos. 509,897, filed June 30,1984, 556,740, filed Nov. 30,1984, 556,829, filed Dec. 11,1984, 599,047, filed Apr. 11,1984, 599,048, filed Apr. 11,1984, 603,484, filed Apr. 24,1984, 603,485, filed Apr. 24,1984, 618,108, filed June 7,1984 and 618,109, filed June 7,1984, the disclosures of each of which applications are incorporated by reference herein.

Figure 1:
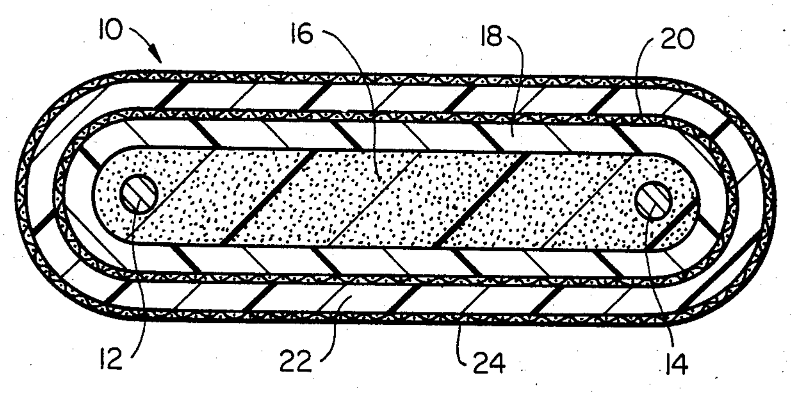
FIG. 1 is a cross-section of a heater for use in the invention.

Attention is now directed to FIG. 1 which shows a heater 10. The heater 10 includes two elongate electrodes 12 and 14 which are connectable to a power supply (not shown). The heater 10 also includes a continuous strip 16 of a PTC conductive polymer that surrounds the electrodes 12 and 14. An insulating jacket 18 encloses this heating member, which is made up of the electrodes 12 and 14 and strip 16. A first electrically conductive member 20 surrounds the insulating jacket 18. In turn, a separating and insulating member 22 surrounds the first conductive member 20. Finally a second electrically conductive member 24 surrounds the first conductive member 20 and is separated and insulated therefrom by the separating member 22.

Figure 2:
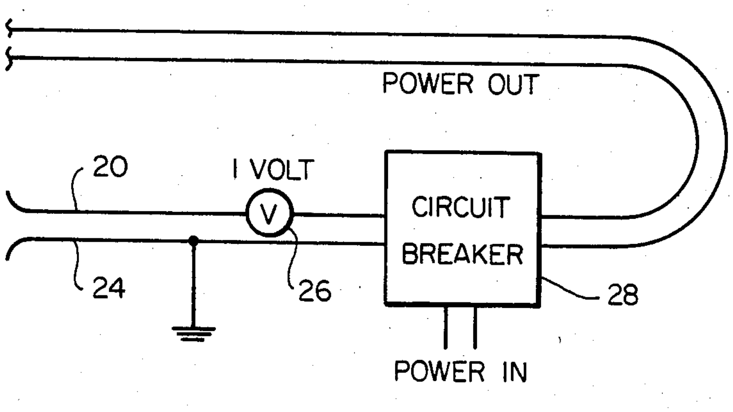
FIGS. 2-4 are schematics of electrical circuits of the invention.

FIG. 2 is a schematic of an electrical circuit of the invention and shows one way of testing the electrical relationship between the first and second electrically conductive xembers 20 and 24. The heater 10 of FIG. 1 may be connected so that the first and second electrically conductive members 20 and 24 are connected to a power supply 26 and ground leaking circuit breaker 28, respectively. Preferably, the power supply 26 is a low voltage, low amperage supply, for example, 1 volt DC, 0.05 milliamp supply. If there is physical damage to the insulating jacket 18, the circuit breaker 28 interrupts power to the heater 10 before a high voltage spark can occur.

Figure 3:
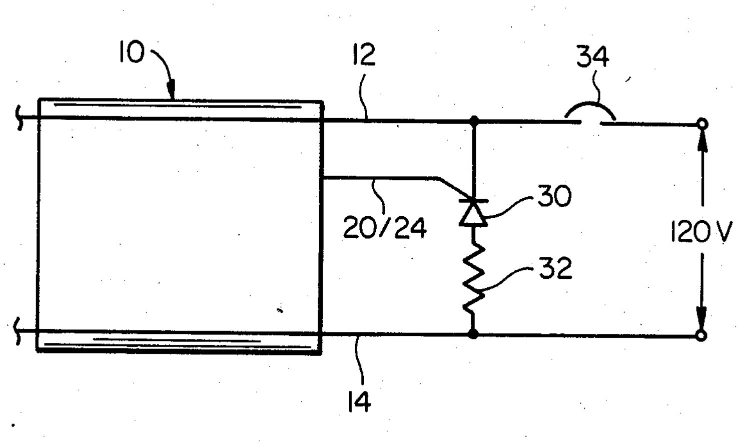

FIG. 3 shows another way of testing the electrical relationship between the first and second electrically conductive members 20 and 24. Here, the electrodes 12 and 14 may be connected to opposite ends of a series triac 30-resistor 32 network, which, in turn, is connected in parallel to the 120V power supply. The triac 30 is also connected to either of the electrically conductive members 20 or 24—the other member then being grounded. The FIG. 3 circuit operates to short the power input to the heater 10 if the two members 20 and 24 become electrically connected. An advantage of this "Crowbar voltage limiter" circuit is that it is able to limit the power available to the heater 10 and thus enhance its safe operation. For some operations, it is advantageous to replace a circuit breaker 34 with a fuse (not shown).

Figure 4:
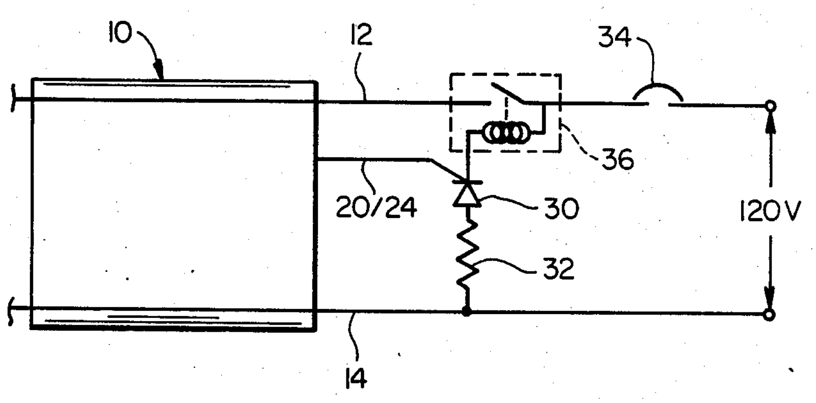

FIG. 4 shows a modification of the FIG. 3 circuit and includes a contactor-relay assembly 36 connected to the triac 30 network. Here, the power to the contactor's coil is interupted by the triac 30 and the contactor switch opens if the electrically conductive members 20 and 24 become electrically connected. Alternatively, but not shown, the contactor coil can be shorted and the contactor switch opened if the members 20 and 24 become electrically connected.

The electrical relationship between the electrically conductive members 20 and 24 can also be tested by a high impedance resistive bridge type circuit (not shown). This circuit advantageously measures small amounts of moisture that can enter the heater 10.

The electrical integrity of the heater 10 can also be monitored by measuring the steady state magnitude of the capacitance defined between the electrically conductive members 20 and 24, and comparing this magnitude against a preselected magnitude of capacitance. Alternatively, a known step function voltage input to conductive members 20 and 24 can be provided so as to provide an incremental, charging capacitance between the members 20 and 24, which charging capactance is then compared against a preselected charging capacitance.

In all of these embodiments, one may use ground fault protectors for independent secondary protection.

I claim:

1. A method for monitoring the integrity of an elongate heater while it is connected to a power supply, and for reducing the power supplied to the heater if the heater incurs physical damage, which method comprises (A) providing an elongate heater, which heater comprises (a) an elongate heating member;

(b) an insulating jacket which encloses the heating member;

(c) a first electrically conductive member which surrounds the insulating jacket;

(d) a separating and insulating member which surrounds the first conductive member; and (e) a second electrically conductive member which surrounds the first conductive member and is separated and insulated therefrom by the separating member;

(B) monitoring the impedance between the first and second electrically conductive members; and (C) providing means which reduces the power supplied available to the elongate heating member when if physical damage to the heater causes the impedance between the first and second electrically conductive members is to be less than a predetermined magnitude.

2. A method according to claim 1, wherein the elongate heater is a self-regulating heater.

3. A method according to claim 1, wherein heating member comprises:

(1) a first elongate electrode;

(2) a second elongate electrode; and (3) a resistive element through which current passes when the first and second electrodes are connected to a power supply.

4. A method according to claim 3, wherein the resistive element comprises a continous strip of a PTC conductive polymer.

5. A method according to claim 1 wherein said power-reducing means disconnects the heater from the power supply if the first and second electrically conductive members become electrically connected.

6. A method according to claim 1 wherein each of the first and second electrically conductive members is a wire braid.

7. A method according to claim 4 wherein each of the first and second electrically conductive members is a wire braid.

* * * * *